(12) United States Patent    (10) Patent No.: US 8,217,818 B2
Choi et al.    (45) Date of Patent: Jul. 10, 2012

(54) DIGITAL RF CONVERTER AND RF CONVERTING METHOD THEREOF

(75) Inventors: Jang Hong Choi, Daejeon (KR); Hyun Ho Boo, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 19 days.

(21) Appl. No.: 12/902,125

(22) Filed: Oct. 11, 2010

(65) Prior Publication Data

US 2011/0084865 A1    Apr. 14, 2011

(30) Foreign Application Priority Data

Oct. 12, 2009   (KR) ........................ 10-2009-0096956
Aug. 23, 2010   (KR) ........................ 10-2010-0081571

(51) Int. Cl.
*H03M 1/66*    (2006.01)
(52) U.S. Cl. ...................................................... 341/144
(58) Field of Classification Search .................. 341/143, 341/136, 144; 375/295
See application file for complete search history.

(56) References Cited

U.S. PATENT DOCUMENTS

| | | | |
|---|---|---|---|
| 6,937,848 B2 * | 8/2005 | Eloranta et al. | 455/118 |
| 6,980,779 B2 * | 12/2005 | Shakeshaft et al. | 455/127.1 |
| 7,205,924 B2 * | 4/2007 | Vemulapalli et al. | 341/166 |
| 7,528,754 B1 * | 5/2009 | Bakkaloglu et al. | 341/143 |
| 2005/0111573 A1 | 5/2005 | Shakeshaft et al. | |
| 2006/0094376 A1 | 5/2006 | Lee et al. | |
| 2009/0131004 A1 | 5/2009 | Kwon et al. | |

FOREIGN PATENT DOCUMENTS

| | | |
|---|---|---|
| JP | 06-224955 A | 8/1994 |
| JP | 07-336402 A | 12/1995 |
| KR | 1020070119045 A | 12/2007 |
| KR | 1020080003451 A | 1/2008 |

OTHER PUBLICATIONS

Petri Eloranta et al., "A Multimode Transmitter in 0.13 μm CMOS Using Direct-Digital RF Modulator", IEEE Journal of Solid-State Circuits, Dec. 2007, pp. 2774-2784, vol. 42, No. 12, IEEE.
Albert Jerng et al., "A Wideband ΔΣ Digital-RF Modulator for High Data Rate Transmitters", IEEE Journal of Solid-State Circuits, Aug. 2007, pp. 1710-1722, vol. 42, No. 8, IEEE.
Shahin Mehdizad Taleie et al., "A 0.18 μm CMOS Fully Integrated RFDAC and VGA for WCDMA Transmitters", IEEE Radio Frequency Integrated Circuits Symposium, 2008, pp. 157-160, IEEE.
Petri Eloranta et al., "Direct-Digital RF Modulator IC in 0.13 μm CMOS for Wide-Band Multi-Radio Applications", IEEE International Solid-State Circuits Conference, 2005, pp. 532-533 & 615, vol. 29, No. 2, IEEE.

* cited by examiner

*Primary Examiner* — Brian Young

(57) ABSTRACT

Provided are a digital radio frequency (RF) converter and an RF converting method thereof. The RF frequency converter includes first and second RF output terminals of a differential form outputting an RF signal; a differential switch selectively connecting first and second nodes into the first and second RF output terminals in response to an oscillating waveform; at least one digital delay device column outputting a plurality of unit bits by sequentially delaying an input bit corresponding to the digital input signal; a front-end processor summing an output of the at least one digital delay device column; a plurality of current sources; and a plurality of first switches corresponding to the plurality of current sources, respectively, and delivering currents of current sources whose number corresponds to the sum value of the front-end processor among the plurality of current sources, to one of the first and second nodes.

18 Claims, 8 Drawing Sheets

DIGITAL RF CONVERTER AND RF CONVERTING METHOD THEREOF

CROSS-REFERENCE TO RELATED APPLICATIONS

This U.S. non-provisional patent application claims priority under 35 U.S.C. §119 of Korean Patent Application No. 10-2009-0096956, filed on Oct. 12, 2009 and 10-2010-0081571, filed on Aug. 23, 2010 the entire contents of which are hereby incorporated by reference.

BACKGROUND OF THE INVENTION

The present invention disclosed herein relates to a digital radio frequency (RF) converter and an RF converting method thereof, and more particularly, to a digital RF converter modulating a digital signal of a baseband into an analog signal of an RF band and an RF converting method thereof.

According to a typical analog-based RF transmitter, a digital analog converter (DAC) converts in-phase (I) and quadrature (Q) signals having a plurality of digital bits into I and Q analog signals, respectively. The digital signal has an original image component. This image component is generated at a multiple of a sampling frequency in the DAC and then is shown in the I and Q analog signals. Accordingly, a low pass filter (LPF) removes the image component from the I and Q analog signals.

Next, the I and Q analog signals passing through the LPF is up-converted into an RF signal after multiplied by I and Q local oscillator signals in a mixer and then is added. A spurious wave or noise, which is caused by a nonlinear characteristic of the mixer, is removed from the up-converted RF signal using an RF band pass filter (BPF). The RF signal passing through the RF BPF is amplified by an amplifier to be fit for transmitter output power specification and then is transmitted to an antenna through a duplex/switch.

An RF transmitter has a radical limitation that an analog circuit has. That is, in case of the analog circuit, since nonlinearity and matching property between devices are improper, entire performance of the RF transmitter may be deteriorated and performance decrease may occur especially due to temperature and process changes. Moreover, as a frequency bandwidth of a signal is increased, designing a semiconductor integrated circuit (IC) of the LPF becomes more complex and especially, since the minimum line width of a semiconductor device is reduced and a power voltage is lowered as recently, it is difficult to meet design specification during designing of the LPF. Furthermore, when the LPF and DAC are realized with an analog circuit, a broader circuit area is required.

SUMMARY OF THE INVENTION

The present invention provides a digital radio frequency (RF) converter improving performance of an RF transmitter and an RF converting method thereof.

Embodiments of the present invention provide RF converters converting a digital input signal into an RF signal, including: first and second RF output terminals of a differential form outputting an RF signal; a differential switch selectively connecting first and second nodes into the first and second RF output terminals in response to an oscillating waveform; at least one digital delay device column outputting a plurality of unit bits by sequentially delaying an input bit corresponding to the digital input signal; a front-end processor summing an output of the at least one digital delay device column; a plurality of current sources; and a plurality of first switches corresponding to the plurality of current sources, respectively, and delivering currents of current sources whose number corresponds to the sum value of the front-end processor among the plurality of current sources, to one of the first and second nodes.

In some embodiments, the front-end processor may generate a plurality of control signals controlling the plurality of first switches, respectively; and the number of control signals corresponding to the sum value among the plurality of control signals may have a value allowing a first switch to turn on and the number of remaining control signals may have a value allowing the first switch to turn off.

In other embodiments, the digital RF converters may further include a plurality of second switches corresponding to the plurality of current sources, respectively, and selecting one of the first and second nodes to which currents of current sources whose number corresponds to the sum value are delivered.

In still other embodiments, the front-end processor may generate a plurality of control signals controlling the plurality of second switches, respectively; and the control signal may have a value selecting the first node if the sum value is positive and may have a value selecting the second node if the sum value is negative.

In even other embodiments, the at least one digital delay device column may include a plurality of digital delay devices connected in series and sequentially delaying the input bit of a 1-bit.

In yet other embodiments, the at least one digital delay device column may include a plurality of digital delay device columns; and each digital delay device column may include a plurality of digital delay devices connected in series and sequentially delaying an input bit of a 1-bit.

In further embodiments, the digital RF converters may further include an encoder converting the digital input signal of an L bit into M unit bits; the M unit bits may be inputted as the input bit of the plurality of digital delay device columns; and the L and M may be integers greater than 2.

In still further embodiments, the digital input signal may be an output of a delta sigma modulator.

In even further embodiments, the differential switch may connect the first and second nodes to the first and second RF output terminals, respectively, in response to a high voltage of the oscillating waveform, and may connect the first and second nodes to the second and first RF output terminals, respectively, in response to a low voltage of the oscillating waveform.

In yet further embodiments, the first and second output terminals may be connected to an RF load.

In other embodiments of the present invention, RF converting methods converting a digital input signal into an RF signal in a digital RF converter include: sequentially delaying an input bit corresponding to the digital input signal; summing a plurality of unit bits delayed sequentially and outputted; delivering a current corresponding to the sum value into one node of first and second nodes; and outputting an RF signal by connecting the one node to one of the first and second RF output terminals in response to an oscillating waveform.

In some embodiments, the delivering of the current may include delivering currents of current sources whose number corresponds to the sum value among a plurality of current sources corresponding to the number of the plurality of unit bits into the one node.

In other embodiments, the delivering of the current may include determining the first node as the one node if the sum value is positive and determining the second node as the one node if the sum value is negative.

In still other embodiments, the outputting of the RF signal may include connecting the one node to the first RF output terminal when the oscillating waveform is a high voltage and connecting the one node to the second RF output terminal when the oscillating waveform is a low voltage.

In even other embodiments, the methods may further include converting the digital input signal into M unit bits when the digital input signal is an L bit and outputting the M unit bits as the input bit, wherein the delaying of the input bit includes sequentially delaying the M unit bits.

In yet other embodiments, the methods may further include performing delta sigma modulation on a digital signal of a baseband and outputting the digital input signal.

In still other embodiments of the present invention, RF transmitters converting a digital signal of a baseband into an RF signal and transmitting the converted RF signal include: a modulator modulating the digital signal of the baseband and outputting a digital input signal; and a digital RF converter outputting a plurality of unit bits by sequentially delaying an input bit corresponding to the digital input signal and outputting an RF signal by delivering a current corresponding to a sum value of the plurality of unit bits into one of first and second RF output terminals of a differential form.

In some embodiments, the modulator may perform delta sigma modulation on the digital signal to output the digital input signal.

In other embodiments, the digital RF converter may include: a differential switch selectively connecting first and second nodes into the first and second RF output terminals in response to an oscillating waveform; a plurality of current sources corresponding to the plurality of unit bits, respectively; and a front-end processor generating a first control signal and a second control signal, the first control signal selecting one node of the first and second nodes based on a sign of the sum value, the second control signal selecting a current source for delivering a current to the one node among the plurality of current sources, wherein the number of current sources selected by the second control signal corresponds to the sum value.

In still other embodiments, the digital RF converter may further include an encoder converting the digital input signal of an L bit into M unit bits, the encoder delaying the M unit bits as the input bit.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

The meaning of "include," "comprise," "including," or "comprising," specifies a property, a region, a fixed number, a step, a process, an element and/or a component but does not exclude other properties, regions, fixed numbers, steps, processes, elements and/or components.

A digital radio frequency (RF) converter, an RF converting method thereof, and an RF transmitter according to an embodiment of the inventive concept will be described in more detail with reference to the drawings.

Figure 1:
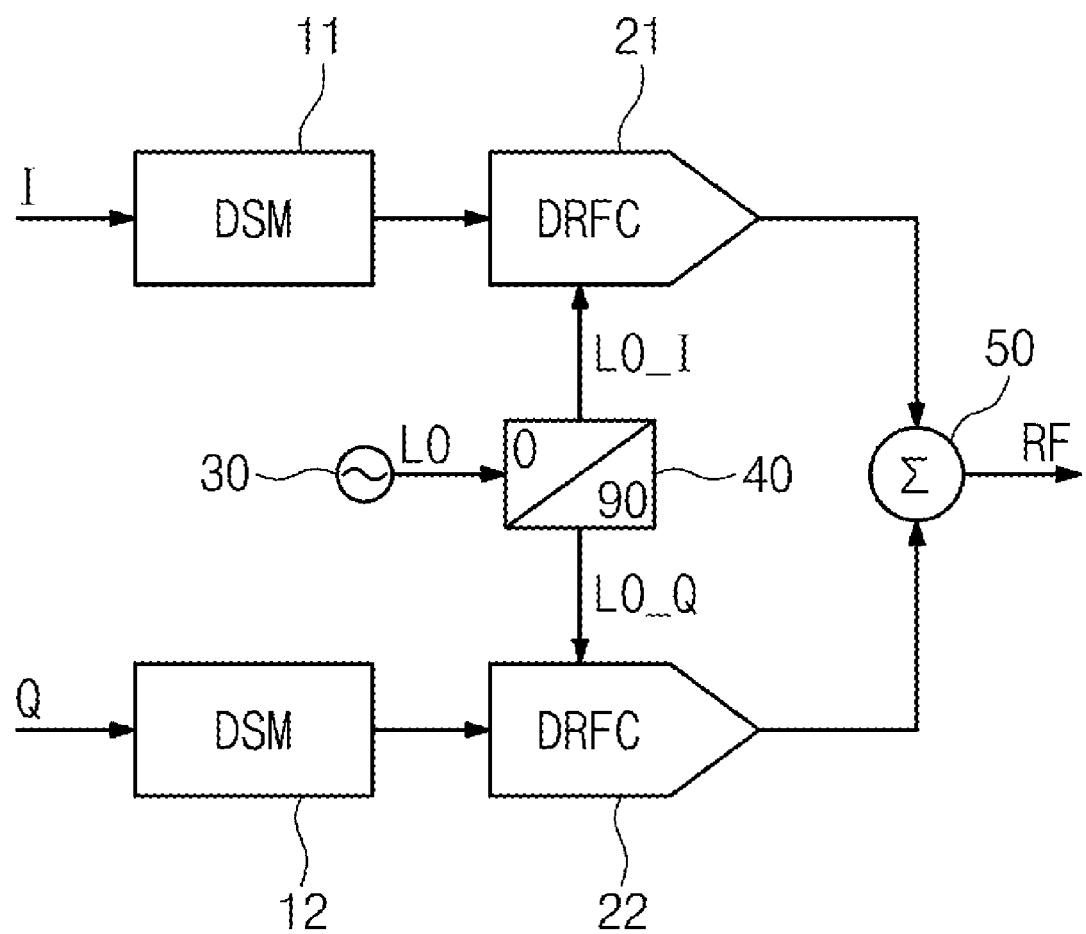
FIG. 1 is a schematic block diagram of an RF transmitter according to an embodiment of the inventive concept.

FIG. 1 is a schematic block diagram of an RF transmitter according to an embodiment of the inventive concept.

Referring to FIG. 1, the RF transmitter includes delta sigma modulators (DSMs) 11 and 12, digital to RF converters (DRFCs) 21 and 22, a local oscillator 30, a quadrature oscillating waveform generator 40, and an adder 50.

The DSMs 11 and 12 perform delta sigma modulation on I and Q digital signals of a baseband having the respective finite number of bits and then output the I and Q digital signals having a unit bit (i.e., 1-bit) or bits having the number less than the bit number of the I and Q digital signals of a baseband. The DSMs 11 and 12 may generate quantization noise of a signal band at near its sampling frequency using delta sigma modulation.

The DRFCs 21 and 22 up-convert the output signals of the DSMs 11 and 12 into I and Q analog RF signals in response to respective I and Q oscillating waveforms L0_I and L0_Q. The local oscillator 30 generates an oscillating waveform L0 and the quadrature oscillating waveform generator 40 generates the I oscillating waveform L0_I and Q oscillating waveform L0_Q and delivers them to the DRFCs 21 and 22, respectively.

The adder 50 sums the I analog RF signal outputted from the DRFC 21 and the Q analog RF signal outputted from the DRFC 22 and then outputs the summed analog RF signals.

The generated RF signals are inputted to an RF band pass filter (BPF) (not shown) if necessary so that a spurious wave or noise is removed and their power may be adjusted through an amplifier. Additionally, the RF signals are transmitted through a transmitting antenna using a duplexer/switch.

Figure 2:
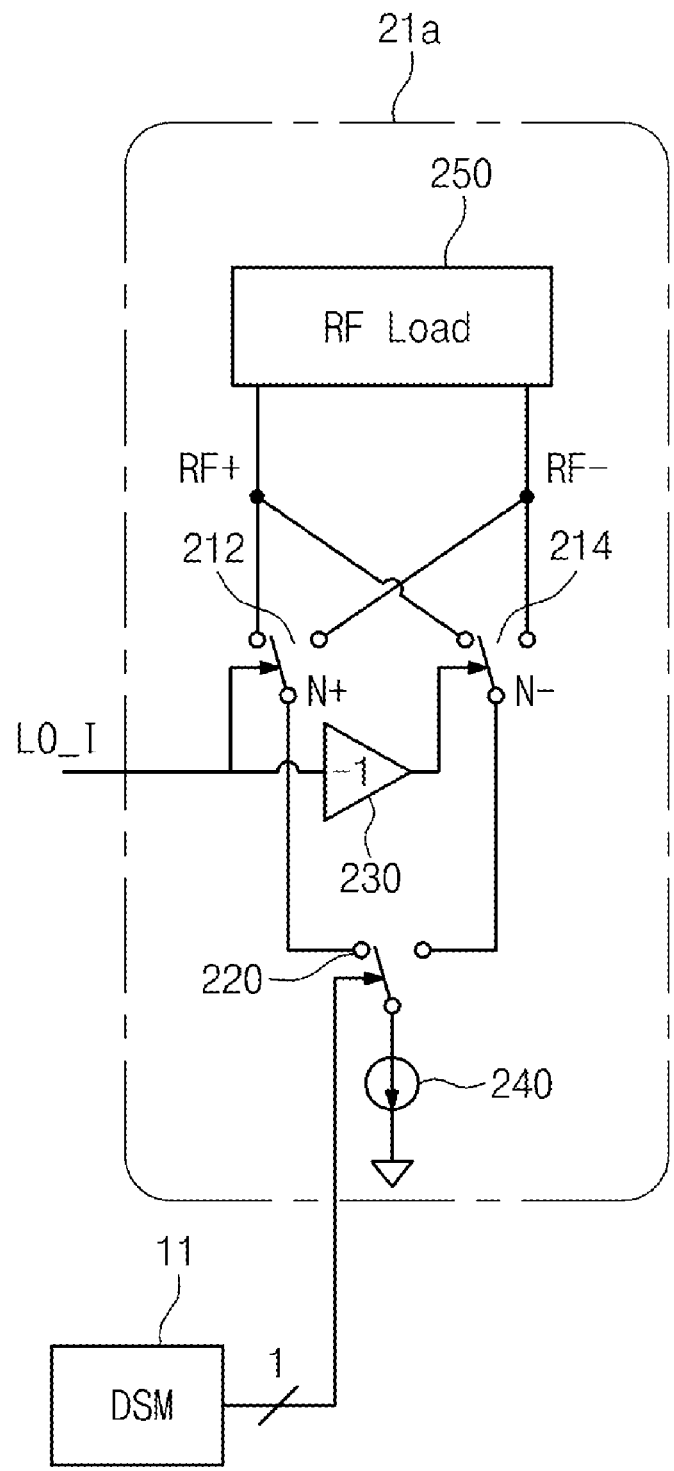
FIG. 2 is a schematic view illustrating one example of the DRFC.
Figure 3:
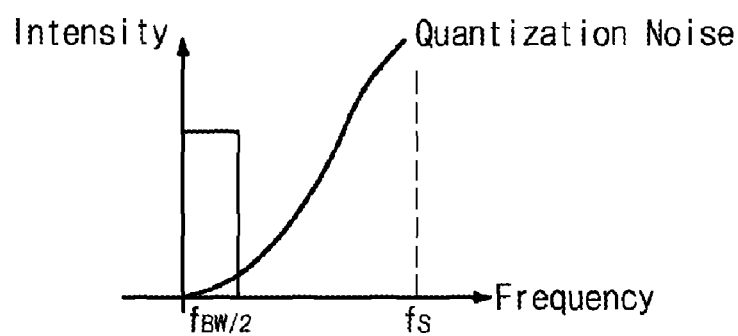
FIG. 3 is a view illustrating an output and output noise of the DSM.
Figure 4:
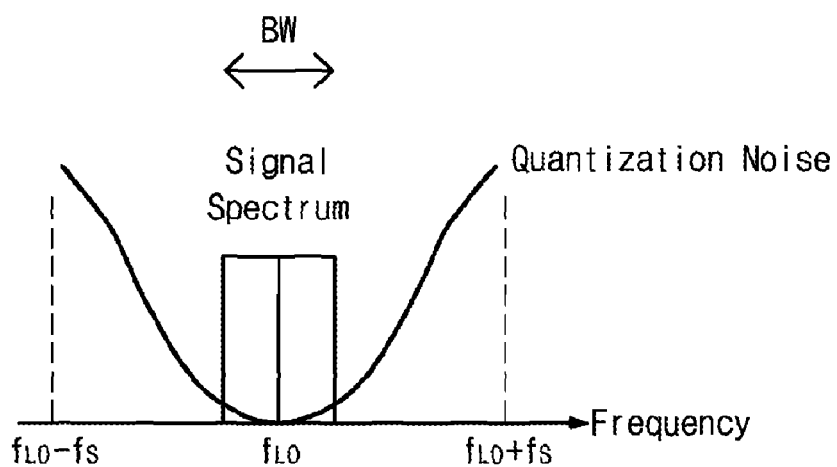
FIG. 4 is a view illustrating an output and output noise of the DRFC of FIG. 2.

FIG. 2 is a schematic view illustrating one example of the DRFC. FIG. 3 is a view illustrating an output and output noise of the DSM. FIG. 4 is a view illustrating an output and output noise of the DRFC of FIG. 2.

Referring to FIG. 2, the DRFC 21a includes switches 212 and 214, a current switch 220, an inverter 230, a current source 240, and positive and negative RF output terminals RF+ and RF−.

The switches 212 and 214 operate as a differential switch for an oscillating waveform L0_I from a local oscillator. One terminals of the switches 212 and 214 switch the positive output terminal RF+ and the negative output terminal RF− connected in a differential form to an RF load 250. For example, one terminal of the switch 212 is connected to the positive output terminal RF+ in response to a high voltage of the oscillating waveform L0_I, and is connected to the negative output terminal RF− in response to a low voltage of the oscillating waveform L0_I. The switch 214 operates conversely to the switch 212. For this, the inverter 230 inverts the oscillating waveform L0_I and delivers it to the switch 214. The RF load 250 includes loads (e.g., a resistor) connecting a power source (not shown) to each of the two output terminals RF+ and RF−. The two output terminals RF+ and RF− are connected through two external loads (not shown) and this connection path becomes an RF path.

Respective terminals of two switches 212 and 214 are connected to two nodes N+ and N− and the two nodes N+ and N− are selectively connected to the current source 240 through the current switch 220. For example, the current switch 220 connects the positive node N+ to the current source 240 in response to an output bit of '1' and connects the native node N− to the current source 240 in response to an output bit of '−1'.

In this manner, according to an output 1 bit of the DSM 11, a current of the current source 240 switches into one of the two node N+ and N− and according to a voltage of the oscillating waveform L0_I, the current delivered to one of the two nodes N+ and N− switches into one of the two output terminals RF+ and RF−, such that the DRFC 21a may up-convert the output 1 bit of the DSM 11 into an analog RF signal.

Moreover, if an output of the DSM 11 is analyzed on a frequency spectrum, it is a 1-bit. Thus, quantization noise becomes significant. As shown in FIG. 3, due to characteristics of the DSM 11, most of the quantization noise is not in a signal band (0 to $f_{BW/2}$) but is distributed over a sampling frequency of the DSM 11. Accordingly, if the sampling frequency is increased, noise characteristics of a signal band may be enhanced. However, since the sampling frequency cannot be increased limitlessly due to limitations of power consumption and an operating speed of a digital circuit, quantization noise of the DSM 11 needs to be removed to prevent performance deterioration of a transmitter-receiver. If quantization noise of the DSM 11 is not removed like the DRFC 21a of FIG. 2, it is converted into an RF frequency band through a switching operation in response to the oscillating waveform L0_I as shown in FIG. 4. In FIG. 4, $f_{LO}$ is a frequency of the oscillating waveform L0_I.

Figure 5:
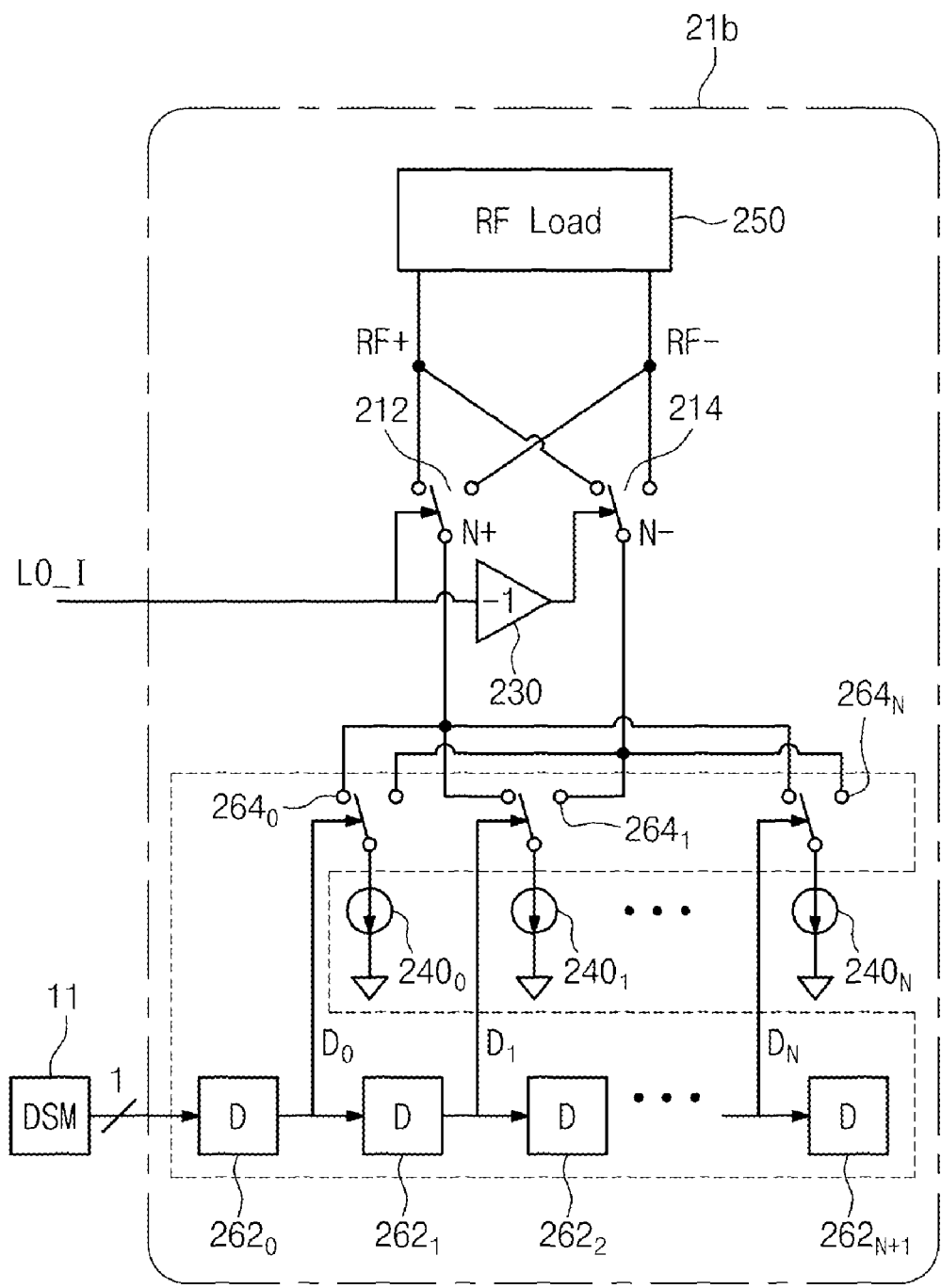
FIG. 5 is a view illustrating another example of the DRFC.
Figure 6:
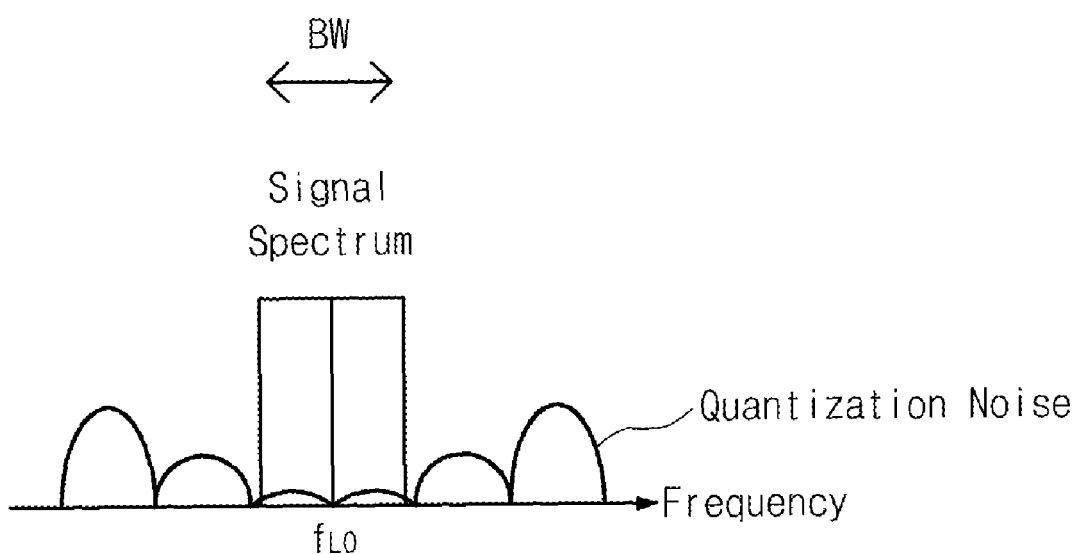
FIG. 6 is a view illustrating an output and output noise of the DRFC of FIG. 5.

FIG. 5 is a view illustrating another example of the DRFC 21b. FIG. 6 is a view illustrating an output and output noise of the DRFC of FIG. 5.

Referring to FIG. 5, the DRFC 21b includes a finite impulse response (FIR) filter 260 connected to an output of the DSM 11 instead of the current switch 220, unlike the DRFC 21a of FIG. 2.

The FIR filter 260 is a hybrid mode FIR filter that replaces an adder with an analog circuit in a typical digital FIR filter and includes a digital delay device column $262_0$ to $262_{N+1}$ and a plurality of current switches $264_0$ to $264_N$. The digital delay device column $262_0$ to $262_{N+1}$ includes a plurality of digital delay devices $262_0$ to $262_{N+1}$ connected in series to an output of the DSM 11. Each of the digital delay devices $262_0$ to $262_N$ delays an input and outputs the delayed input to the adjacent digital delay devices $262_1$ to $262_{N+1}$. At this point, each of the digital delay devices $262_1$ to $262_{N+1}$ may delay an input by a period of a digital sampling frequency. One terminals of the plurality of current switches $264_0$ to $264_N$ are selectively connected to two nodes N+ and N− in response to outputs $D_0$ to $D_N$ of the digital delay devices $262_0$ to $262_N$, and the other terminals are connected to a plurality of current sources $240_0$ to $240_N$. Accordingly, the current switches $264_0$ to $264_N$ switch currents of the corresponding current sources $240_0$ to $240_N$ to one of the two nodes N+ and N−. Then, according to the outputs $D_0$ to $D_N$ of the digital delay devices $262_0$ to $262_N$, each of the node N+ and N− may function as an FIR filter, with currents of the current sources $240_0$ to $240_N$ connected to the node N+ and N− and characteristics of the FIR filter may vary according to the number of the digital delay devices $262_0$ to $262_N$.

In this case, as shown in FIG. 3, in relation to a frequency spectrum of the outputs $D_0$ to $D_N$ of the digital delay devices $262_0$ to $262_N$, quantization noise is mainly distributed in a sampling frequency, but in relation to a frequency spectrum of an RF frequency band, quantization noise is removed using a property of the FIR filter.

Generally, it is quite probable that a 1-bit output of the DSM 11a may have +1 and −1 alternately. Then, since the outputs $D_0$ to $D_N$ of the digital delay devices $262_0$ to $262_N$ have +1 and −1 alternately, if a current size supplied from the current sources $240_0$ to $240_N$ is the same, the same size of a current is supplied to the two nodes N+ and N−. Since the two nodes N+ and N− are alternately connected to output terminals RF+ and RF− according to an oscillating waveform L0_I, the same size of a current is delivered to the two output terminals RF+ and RF−. In this case, although a total differential current amount flowing in an RF path, connected to the output terminals RF+ and RF− through an external load, is 0, since a current of the current sources $240_0$ to $240_N$ continuously flows, unnecessary current consumption occurs. Additionally, when the outputs $D_0$ to $D_N$ of the digital delay devices $262_0$ to $262_N$ have +1 and −1 alternately, although a current of the RF path is 0, the current switches $264_0$ to $264_N$ are not ideal for realizing an actual semiconductor circuit. Thus, noise may be delivered to an RF frequency band through the current switches $264_0$ to $264_N$.

Figure 7:
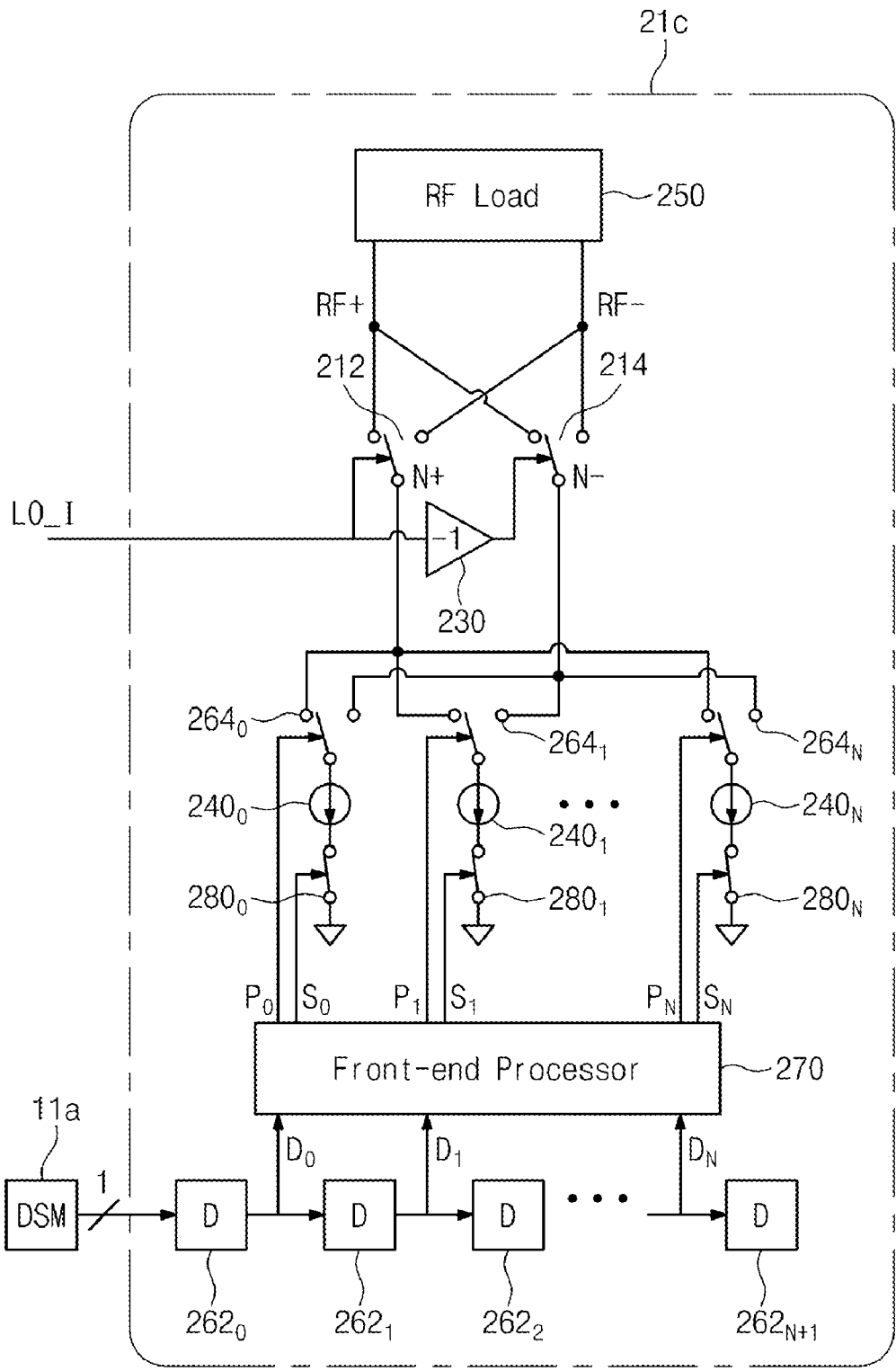
FIGS. 7 and 8 are views illustrating DRFCs and according to an embodiment of the inventive concept.
Figure 8:
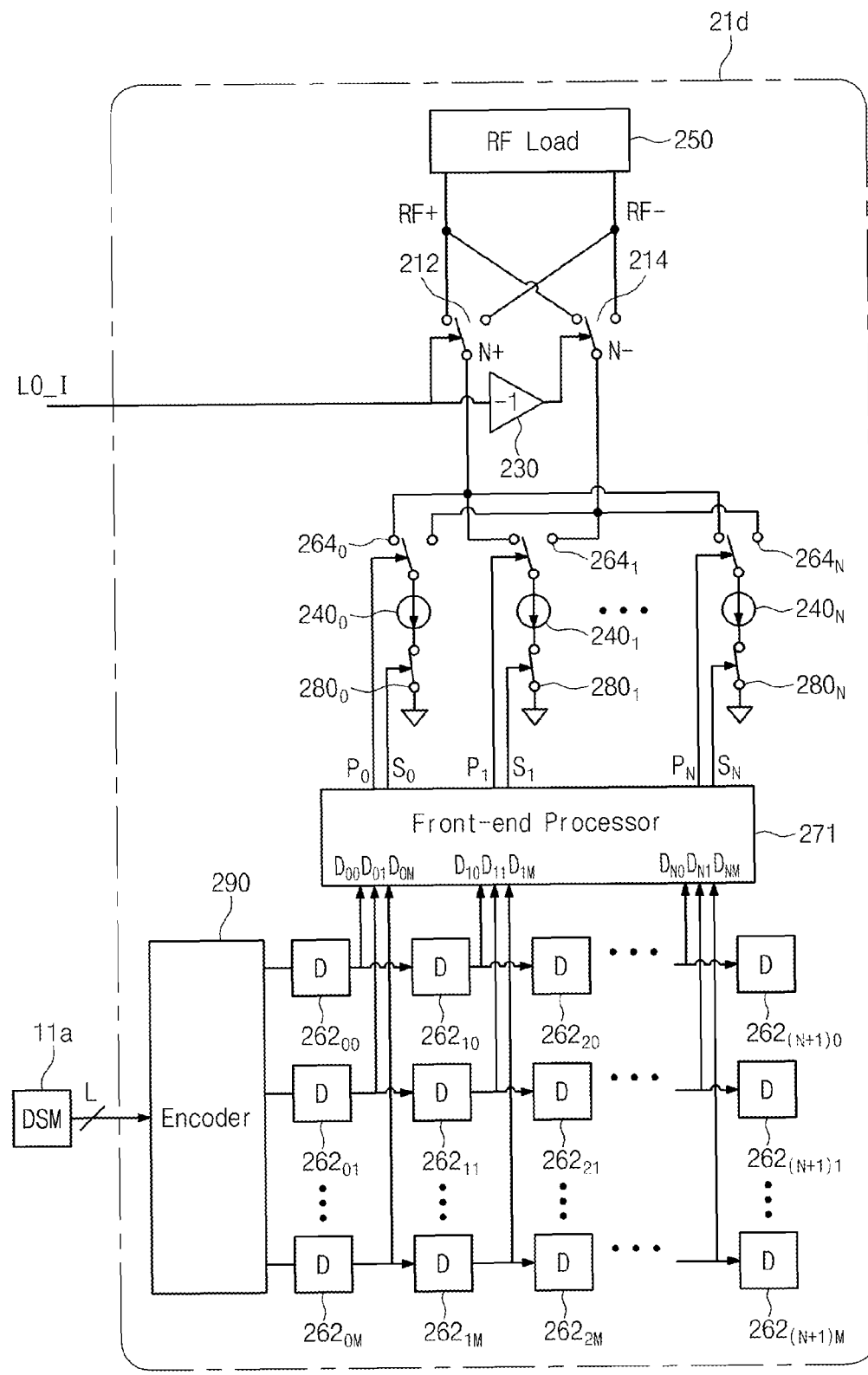

FIGS. 7 and 8 are views illustrating DRFCs 21c and 21d according to an embodiment of the inventive concept.

Referring to FIG. 7, the DRFC 21c further includes a digital front-end processor 270 and a plurality of cut-off switches $280_0$ to $280_N$, unlike the DFRC 21b of FIG. 5.

The digital front-end processor 270 receives outputs $D_0$ to $D_N$ of the digital delay devices $262_0$ to $262_N$ and generates control signals $P_0$ to $P_N$ and $S_0$ to $S_N$ to operate current switches $264_0$ to $264_N$ and the cut-off switches $280_0$ to $280_N$. In more detail, the digital front-end processor 270 calculates a total current amount delivered from the outputs $D_0$ to $D_N$ of the digital delay devices $262_0$ to $262_N$ to an RF path and determines the control signals $P_0$ to $P_N$ and $S_0$ to $S_N$ to allow current sources $240_0$ to $240_N$ to supply only a current corresponding to the calculated total current amount. As one example, the digital front-end processor 270 calculates the sum of the outputs $D_0$ to $D_N$ of the digital delay devices $262_0$ to $262_N$ and determines the control signals $S_0$ to $S_N$ to allow only the current sources $240_0$ to $240_N$ whose number corresponds to the sum to deliver a current to the nodes N+ and N−. Moreover, the digital front-end processor 270 may determine the control signals $P_0$ to $P_N$ to deliver a current to the positive node N+ if the total is positive or to the negative N− if the total is negative. Furthermore, if the total is 0, a current delivered to the nodes N+ and N− is 0. The digital front-end processor 270 determines the control signals $P_0$ to $P_N$ in the same manner (i.e., in case that a total is positive or negative), or in a different way.

The cut-off switches $280_0$ to $280_N$ allow a current to flow or cut off a current in response to the control signals $S_0$ to $S_N$, and for example, if a corresponding control signal is '1', they allow a current to flow and if a corresponding control signal is '0', they cut off a current.

As one example, if N is 3 and $D_0=-1$, $D_1=1$, $D_2=1$, and $D_3=1$, since a total current amount delivered to the RF path is (2*I) (here, I is a current amount delivered to the RF path using one current source), the digital front-end processor 270 may determine the control signals $P_0$ to $P_3$ as '1', the control signals $S_0$ to $S_1$ as '1', and the control signals $S_2$ to $S_3$ as '0'. Then, the cut-off switches $280_0$ to $280_1$ allow a current to flow and the cut-off switches $280_2$ to $280_4$ cut off a current, such that only currents of the two current sources $240_0$ and $240_1$ may be delivered to the positive node N+.

Next, referring to FIG. 8, the DRFC 21d receives an L bit from the DSM 11a, unlike FIG. 7 (L is an integer greater than 2). Accordingly, the DRFC 21d further includes an encoder 290 and digital delay devices $262_{00}$ to $262_{(N+1)M}$.

The encoder 290 converts the L bit of the DSM 11a into a unit bit and then outputs M+1 unit bits $T_0$ to $T_M$ ($M=2^L-1$). For this, the encoder 290 may be realized using a thermometer encoder. The digital delay devices $262_{00}$ to $262_{(N+1)M}$ include M+1 digital delay device columns $262_{00}$ to $262_{(N+1)0}$, $262_{00}$ to $262_{(N+1)0}$, ..., $262_{00}$ to $262_{(N+1)0}$. Each digital delay device column $262_{0i}$ to $262_{(N+1)i}$ includes a plurality of digital delay devices $262_{0i}$ to $262_{(N+1)i}$ connected in series to the corresponding output $T_i$ of the encoder 290.

The digital front-end processor 270 calculates a total of the outputs $D_{00}$ to $D_{NM}$ of the digital delay devices $262_{00}$ to $262_{NM}$ and determines the control signals $S_0$ to $S_N$ in order to allow only the N current sources $240_0$ to $240_N$ corresponding to the total to deliver a current to the node N+ and N−.

In this manner according to the embodiments described with FIGS. 7 and 8, since only current sources corresponding to a total current amount delivered to the RF path supply currents, unnecessary power consumption, caused when currents are supplied from all current sources, may be prevented. Additionally, since currents of the remaining current sources excluding those corresponding to a total current amount are cut-off by cut-off switches, noise may be prevented from being delivered to an RF frequency band through current switches corresponding to the current sources. Furthermore, as mentioned with reference to the circuit of FIG. 5, quantization noise may be removed using property of the FIR filter, such that performance of an RF transmitter may be improved.

Next, with reference to FIG. 9, the digital front-end processor 270 of FIG. 7 or 8 will be described in more detail.

Figure 9:
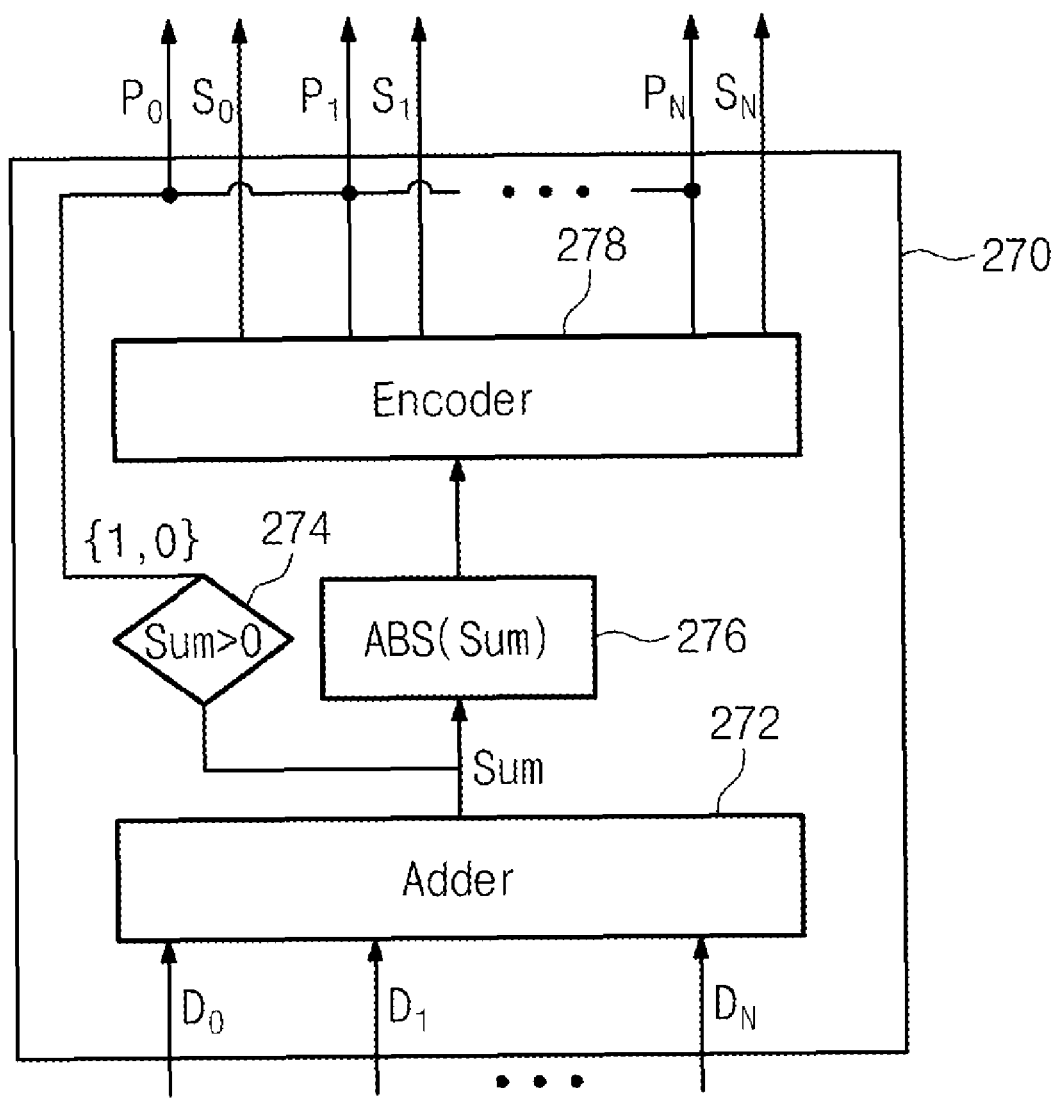
FIG. 9 is a view illustrating a front-end processor of a DRFC according to an embodiment of the inventive concept.

FIG. 9 is a view illustrating a front-end processor of a DRFC according to an embodiment of the inventive concept. In FIG. 9, the digital front-end processor 270 of the DFRC 21c of FIG. 7 is used as an example for convenience of description.

Referring to FIG. 9, the digital front-end processor 270 includes an adder 272, a comparator 274, an absolute value calculator 276, and an encoder 278.

The adder 272 calculates the sum of the outputs $D_0$ to $D_N$ of the digital delay devices $262_0$ to $262_N$. The comparator 274 determines whether the sum of the adder 272 is positive or negative. Then, the comparator 274 outputs '1' as control signals $P_0$ to $P_N$ if it is positive, and outputs '0' as control signals $P_0$ to $P_N$ if it is negative. If the sum is 0, the comparator 274 may output one (e.g., '0') of '1' and '0'. The absolute value calculator 276 calculates the absolute value of the sum and the encoder 278 converts the absolute value into a unit bit and outputs it as the control signals $S_0$ to $S_N$. For this, the encoder 278 may be realized using a thermometer encoder.

In FIGS. 2, 5, 7, and 8, although the DRFCs 21a, 21b, 21c, and 21d connected to the DSM 11 outputting an I digital signal are illustrated, the DRFC 22 connected to the DSM 12 outputting a Q digital signal may be identically realized like the DRFCs 21a, 21b, 21c, and 21d of FIGS. 2, 5, 7, and 8. In this case, the differential switches 212 and 214 may operate in response to the Q oscillating waveform L0_Q of FIG. 1.

According to an embodiment of the inventive concept, the performance of an RF transmitter may be improved by removing quantization noise. According to another embodiment of the inventive concept, only current sources corresponding to a total current value delivered to an RF path are used such that unnecessary power consumption may be prevented. According to further another embodiment of the inventive concept, it may be prevented that noise is delivered to an RF frequency band through a switch.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A digital radio frequency (RF) converter converting a digital input signal into an RF signal, comprising:
    at least one digital delay device column for outputting a plurality of unit bits by sequentially delaying an input bit corresponding to the digital input signal;
    a front-end processor for summing an output of the at least one digital delay device column;
    a plurality of current sources; and
    a plurality of first switches corresponding to the plurality of current sources, respectively, and for delivering currents of current sources whose number corresponds to the sum value of the front-end processor among the plurality of current sources, to one of first and second nodes in order to output an RF signal into a differential form through first and second RF output terminals selectively connected by a differential switch responded to an oscillating waveform.

2. The digital RF converter of claim 1, wherein the front-end processor generates a plurality of control signals controlling the plurality of first switches, respectively; and
    the number of control signals corresponding to the sum value among the plurality of control signals has a value allowing a first switch to turn on and the number of remaining control signals has a value allowing the first switch to turn off.

3. The digital RF converter of claim 1, further comprising a plurality of second switches corresponding to the plurality of current sources, respectively, and selecting one of the first and second nodes to which currents of current sources whose number corresponds to the sum value are delivered.

4. The digital RF converter of claim 3, wherein the front-end processor generates a plurality of control signals controlling the plurality of second switches, respectively; and
    the control signal has a value selecting the first node if the sum value is positive and has a value selecting the second node if the sum value is negative.

5. The digital RF converter of claim 1, wherein the at least one digital delay device column comprises a plurality of digital delay devices connected in series and sequentially delaying the input bit of a 1-bit.

6. The digital RF converter of claim 1, wherein the at least one digital delay device column comprises a plurality of digital delay device columns; and
    each digital delay device column comprises a plurality of digital delay devices connected in series and sequentially delaying an input bit of a 1-bit.

7. The digital RF converter of claim 6, further comprising an encoder converting the digital input signal of an L bit into M unit bits;
the M unit bits are inputted as the input bit of the plurality of digital delay device columns; and
the L and M are integers greater than 2.

8. The digital RF converter of claim 1, wherein the digital input signal is an output of a delta sigma modulator.

9. The digital RF converter of claim 1, wherein the differential switch connects the first and second nodes to the first and second RF output terminals, respectively, in response to a high voltage of the oscillating waveform, and connects the first and second nodes to the second and first RF output terminals, respectively, in response to a low voltage of the oscillating waveform.

10. The digital RF converter of claim 1, wherein the first and second output terminals are connected to an RF load.

11. An RF converting method converting a digital input signal into an RF signal in a digital RF converter, the method comprising:
sequentially delaying an input bit corresponding to the digital input signal;
summing a plurality of unit bits delayed sequentially and outputted;
delivering a current corresponding to the sum value into one node of first and second nodes; and
outputting an RF signal by connecting the one node to one of the first and second RF output terminals in response to an oscillating waveform,
wherein the outputting of the RF signal comprises connecting the one node to the first RF output terminal when the oscillating waveform is a high voltage and connecting the one node to the second RF output terminal when the oscillating waveform is a low voltage.

12. The method of claim 11, wherein the delivering of the current comprises delivering currents of current sources whose number corresponds to the sum value among a plurality of current sources corresponding to the number of the plurality of unit bits into the one node.

13. The method of claim 11, wherein the delivering of the current comprises determining the first node as the one node if the sum value is positive and determining the second node as the one node if the sum value is negative.

14. The method of claim 11, further comprising converting the digital input signal into M unit bits when the digital input signal is an L bit and outputting the M unit bits as the input bit,
wherein the delaying of the input bit comprises sequentially delaying the M unit bits.

15. The method of claim 11, further comprising performing delta sigma modulation on a digital signal of a baseband and outputting the digital input signal.

16. An RF transmitter converting a digital signal of a baseband into an RF signal and transmitting the converted RF signal, comprising:
a modulator modulating the digital signal of the baseband and outputting the modulated digital signal as a digital input signal; and
a digital RF converter outputting a plurality of unit bits by sequentially delaying an input bit corresponding to the digital input signal and outputting an RF signal by delivering a current corresponding to a sum value of the plurality of unit bits into one of first and second RF output terminals of a differential form, where the digital RF converter comprises:
a differential switch selectively connecting first and second nodes into the first and second RF output terminals in response to an oscillating waveform;
a plurality of current sources corresponding to the plurality of unit bits, respectively; and
a front-end processor generating a first control signal and a second control signal, the first control signal selecting one node of the first and second nodes based on a sign of the sum value, the second control signal selecting a current source for delivering a current to the one node among the plurality of current sources,
wherein the number of current sources selected by the second control signal corresponds to the sum value.

17. The RF transmitter of claim 16, wherein the modulator performs delta sigma modulation on the digital signal to output the digital input signal.

18. The RF transmitter of claim 16, wherein the digital RF converter further comprises an encoder converting the digital input signal of an L bit into M unit bits, the encoder delaying the M unit bits as the input bit.

* * * * *